United States Patent [19]

Takanashi et al.

[11] Patent Number: 4,477,182
[45] Date of Patent: Oct. 16, 1984

[54] PATTERN EXPOSING APPARATUS

[75] Inventors: Akihiro Takanashi, Kokubunji; Norikazu Hashimoto, Hachioji; Hisashi Maejima, Higashiyamato; Shuji Sugiyama, Katsuta, all of Japan

[73] Assignee: Hitachi, Ltd., Tokyo, Japan

[21] Appl. No.: 396,880

[22] Filed: Jul. 9, 1982

[30] Foreign Application Priority Data

Jul. 10, 1981 [JP] Japan ................. 56-107003

[51] Int. Cl.³ ............................ G03B 27/52
[52] U.S. Cl. ...................... 355/43; 355/77; 355/53
[58] Field of Search .......... 355/53, 38, 35, 40, 355/43, 39, 54, 112, 77; 354/15, 105, 109; 430/22

[56] References Cited

U.S. PATENT DOCUMENTS 3,844,655 10/1974 Johannsmeier ............ 355/43
4,093,370 6/1978 Frech ..................... 355/43
4,343,877 8/1982 Chiang .................... 430/22

Primary Examiner—L. T. Hix
Assistant Examiner—Brian W. Brown
Attorney, Agent, or Firm—Antonelli, Terry & Wands

[57] ABSTRACT

A pattern exposing apparatus comprising means for projecting a semiconductor device mask pattern onto the photoresist layer coated on a semiconductor substrate, and means for projecting an identification mark which is specific to each substrate onto a part of the photoresist layer.

10 Claims, 3 Drawing Figures

PATTERN EXPOSING APPARATUS

BACKGROUND OF THE INVENTION

The present invention relates to an improved pattern exposing apparatus of the type used in the fabricating processes of large scale integration (LSI) devices using fine patterns.

In processing semiconductor devices, each semiconductor substrate (silicon wafer) is given a specific identification mark for the purpose of carrying out strict quality control and process control for high integration semiconductor devices, such as LSIs, fabricated in the silicon wafer. It has been the practice to manually put an identification mark on each wafer prior to the fabricating process, particularly in a prestage of the photolithographic process, or an identification mark is formed on each wafer with an identification marking machine, such as a wafer identifier. However, such marking operation is not only complicated, but may cause contamination on the wafer, resulting eventually in a fall in the yield of production.

SUMMARY OF THE INVENTION

Accordingly, it is an object of the present invention to provide a pattern exposing apparatus provided with means for forming an identification mark on a wafer without fear of contamination, which eliminates the need for manually putting an identification mark on the wafer or the use of a special identification marking machine.

In order to achieve the foregoing object, the inventive pattern exposing apparatus comprises means for projecting a device pattern on a photoresist layer coated on the wafer and means for projecting an identification mark which is specific to each wafer on a part of the photoresist layer.

By application of the present invention, the conventional manual work for marking identification or the need of a special marking machine is eliminated, and moreover, the wafer contamination problem is alleviated and the fabrication time can be reduced.

DESCRIPTION OF THE PREFERRED EMBODIMENT

Figure 1:
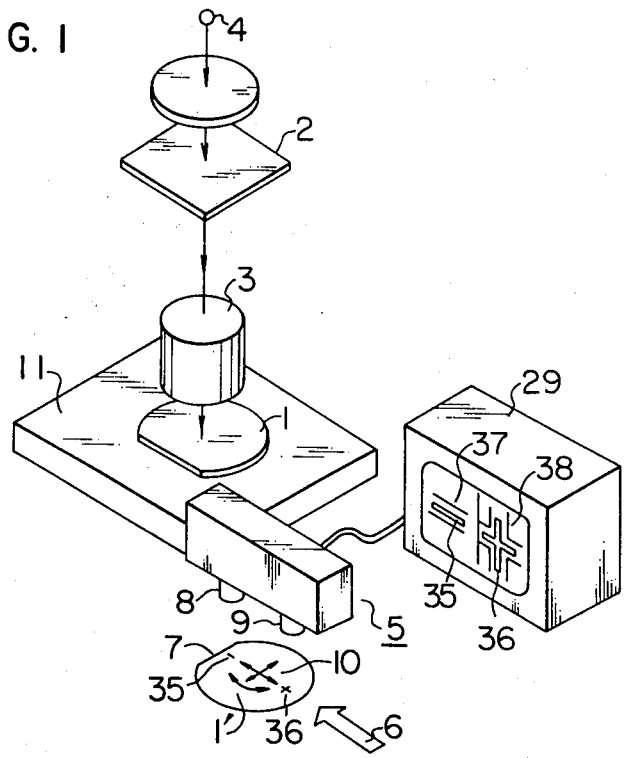
FIG. 1 shows a basic structure of the reduction projection aligner exemplifying the pattern exposing apparatus of the present invention.

FIG. 1 shows a basic structure of the reduction projection aligner exemplifying the inventive pattern exposing apparatus. The reduction projection aligner works in such a way that a silicon wafer 1 with a photosensitive material such as photoresist coated thereon is placed on an exposure stage 11, a reticle pattern 2 is illuminated by an illumination system 4 each time the exposure stage 11 is fed for a certain distance, and the reticle pattern image is projected through a reduction lens 3 onto the wafer 1, whereby reduced patterns originated from the reticle pattern 2 are formed in the whole area of the wafer 1. Semiconductor devices are fabricated by overlapping pattern formations each followed by diffusion, oxidization, etc.

In order to achieve the high accuracy pattern alignment for the overlapped pattern formations, the inventive reduction projection aligner shown in FIG. 1 is provided with a wafer pre-alignment system 5. A silicon wafer 1' to be supplied to the reduction projection aligner is taken from a wafer supply unit (not shown), conveyed in the direction shown by the arrow 6, and set on the stage (not shown) of the wafer pre-alignment system 5. After coarse mechanical positioning of the wafer 1' based on the orientation flat 7 provided thereon, the operator observes alignment marks 35 and 36, e.g., "—" and "+", on the wafer 1' through lens systems 8 and 9 and monitor TV 29, and adjusts the wafer position by moving the stage in the X or Y direction as shown by the arrow 10 or by rotating the stage, so that the alignment marks 35 and 36 on the wafer 1' register with the reference positions (displayed as cursors 37 and 38 on the monitor screen) of the wafer pre-alignment system 5. Next, the wafer 1' is carried by the vacuum chuck of a wafer handler (not shown) onto the exposure stage 11 to be fixed thereto. The wafer 1' is finally positioned accurately on the exposure stage 11, and the above-mentioned pattern exposing process is started. While the pattern exposing process proceeds on the exposure stage 11, the next silicon wafer 1' is taken from the wafer supply unit and set on the stage of the wafer pre-alignment system 5, then the positioning to the reference is carried out by the operator.

By the way, when the first reticle pattern is going to be formed on a wafer, the fine optical positioning by the wafer pre-alignment system 5 is not required (because the alignment marks are initially formed on the wafer when the first reticle pattern is projected), and the wafer is left in the stage of coarse mechanical positioning based on the cut-away 7 of the wafer. After the preceding wafer 1 on the exposure stage 11 is completed, the waiting wafer 1' on the pre-aligner stage is carried by the vaccum chuck handler onto the exposure stage 11 and exposed to the reticle pattern. On completion of the exposing process, the wafer 1 on the exposure stage 11 is carried by a wafer unloader into a wafer storage unit (not shown). Subsequently, the next silicon wafer 1' on the stage of the pre-alignment system 5 is carried onto the exposure stage 11.

The invention contemplates to form the identification mark on the silicon wafer 1' by utilization of the idling time when it is waiting in the wafer pre-alignment system 5.

Figure 2:
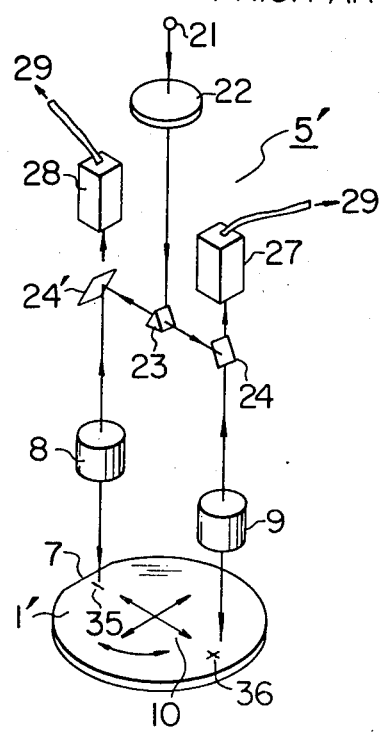
FIG. 2 shows the wafer pre-alignment system used in the conventional reduction projection aligner.

The arrangement of a conventional wafer pre-alignment system which is generally shown by reference number 5' in FIG. 2 will first be described for purposes of explanation of the invention. In FIG. 2, a light beam originated from a Xe (Xenon) lamp light source 21 is transmitted through a filter 22 which cuts off components having wavelengths of 450 nm or less so that a photosensitive material, such as one known by the trade name, AZ1350 Positive-type Photoresist, coated on a silicon wafer 1' does not react to the light. Then, the light beam is divided by a prism 23, and both light beams are led by optical parts including mirrors 24 and 24' and lens systems 8 and 9 onto the silicon wafer 1' as shown by the arrows. Then, images of alignment marks 35 and 36 on the illuminated portions of the wafer 1' are focused through the paths shown by the arrows on optical sensors 27 and 28 for the monitor TV 29. The operator observes the images of the alignment marks 35 and 36 on the monitor screen and moves the wafer 1' in various direction as shown by the arrows 10 so that the images register with respective reference positions (the cursors 37 and 38 as mentioned previously) displayed on the monitor screen.

Figure 3:
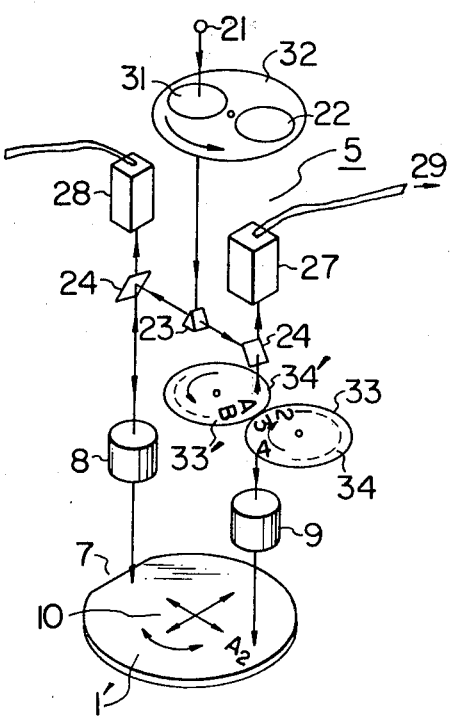
FIG. 3 shows the wafer pre-alignment system used in the apparatus shown in FIG. 1.

FIG. 3 shows a basic arrangement of the wafer pre-alignment system generally shown by reference number 5 which is based on the conventional pre-alignment system 5' of FIG. 2, but also includes the arrangement for forming the identification mark. As shown in FIG. 3, the wafer pre-alignment system 5 according to this embodiment includes the arrangement of the conventional wafer pre-alignment system 5', and further includes: (i) a filter 31 which transmits only light wavelengths sensitive for the photoresist coated on the wafer 1' and a rotary table 32 for mounting the filter 31 as well as the first-mentioned filter 22, and (ii) a pair of rotary tables 34 and 34' for setting identification marks 33 and 33' in accordance with the operator's command.

In operation, during the above-mentioned idling time in forming the first reticle pattern on the silicon wafer 1', the operator directs the apparatus to place the filter 31 and selected identification marks 33 and 33' on the optical axis, thus a set of identification marks, e.g., "A2", specific to each silicon wafer can be formed.

In more detail, the rotary tables 32, 34 and 34' are turned in the respective directions by proper driving means such as gears, so that the filter 31, mark "2" on the rotary table 34 and mark "A" on the rotary table 34' can be positioned on the optical axis. The identification marks 33 and 33' are formed of an opaque material on the transparent rotary tables 34 and 34'. For reading the alignment mark on the wafer 1', the rotary tables 34 and 34' are turned so that the alignment mark formed in the area outside of the identification mark is located on the optical axis. The identification mark is generally formed in the area of the wafer where reticle patterns are not formed, and it may be formed near the alignment mark, typically near the edge of the cut-away 7 or the opposite circumferential edge of the wafer. The stage carrying the wafer 1' may be moved so that the identification mark is formed near the edge of the wafer and it may be repositioned after exposure has completed. In the rest of time, the wafer 1' waits for the transportation on to the exposure stage 11.

Accordingly, the identification mark can be formed without the conventional manual work by the operator or the use of a special marking machine, whereby the wafer contamination problem is alleviated and processing time can be reduced.

In the foregoing embodiment, the identification mark forming means is provided in the wafer pre-alignment system. However, the arrangement is not limited to this case, but the mark forming means may be provided in the main exposure system. It will further be appreciated that the identification mark forming means may be provided in the wafer pre-alignment system of an electron beam lithographic system.

We claim:

1. A pattern exposing apparatus comprising means for projecting a semiconductor device mask pattern onto a photo-sensitive layer coated on a semiconductor substrate; optical positioning means including an optical system for pre-aligning a semiconductor substrate to be exposed next; and means for projecting an identification mark which is specific to each semiconductor substrate onto a part of said photo-sensitive layer, said identification mark projecting means being arranged to share a part of the optical system of said optical positioning means.

2. A pattern exposing apparatus according to claim 1, wherein said identification mark projecting means is provided as an optical system separately from said device mask pattern projecting means.

3. A pattern exposing apparatus according to claim 1, wherein said identification mark projecting means includes a plurality of members each being capable of presenting a character or symbol selected from a variety of characters or symbols.

4. A pattern exposing apparatus according to claim 3, wherein said members are rotary discs each carrying a variety of characters or symbols in a peripheral portion thereof.

5. A pattern exposing apparatus according to claim 3, wherein said members are disposed in proximity to each other and jointly provide characters forming an identification mark.

6. A pattern exposing apparatus according to claim 1, wherein said optical positioning means includes monitor means for pre-aligning a semiconductor substrate with cursors.

7. A pattern exposing apparatus according to claim 1, wherein said shared part of said optical system includes a stage capable of mounting and rotating the semiconductor substrate in the process of effecting alignment thereof.

8. A method of exposing a pattern on a semiconductor substrate, comprising the steps of supplying a semiconductor substrate having a photo-sensitive layer coated on a surface thereof to an alignment station; aligning said semiconductor substrate at said alignment station; projecting an identification mark which is specific to said semiconductor substrate at said alignment station onto said photo-sensitive layer; moving said semiconductor substrate from said alignment station to a main projection station; and projecting a mask pattern onto the photo-sensitive layer of said semiconductor substrate at said main projection station.

9. A method according to claim 8, wherein said step of aligning said semiconductor substrate is carried out using an optical system, and wherein said step of projecting an identification mark onto said photo-sensitive layer employs at least a part of said optical system.

10. A method according to claim 9, wherein said step of projecting an identification mark onto said photo-sensitive layer includes selectively positioning in an optical path of said optical system a member carrying a plurality of identification marks so that a selected identification mark is projected onto said photo-sensitive layer.

* * * * *